(12) United States Patent
Ojha et al.

(10) Patent No.: US 6,754,867 B2
(45) Date of Patent: Jun. 22, 2004

(54) METHOD OF DETERMINING NON-ACCESSIBLE DEVICE I/O PIN SPEED USING ON CHIP LFSR AND MISR AS DATA SOURCE AND RESULTS ANALYZER RESPECTIVELY

(75) Inventors: Ajay Ojha, Beaverton, OR (US); Hehching Harry Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 354 days.

(21) Appl. No.: 09/750,199

(22) Filed: Dec. 28, 2000

(65) Prior Publication Data

US 2002/0087932 A1 Jul. 4, 2002

(51) Int. Cl.[7] ................................................. G06F 11/00
(52) U.S. Cl. ........................... 714/739; 438/17; 326/16
(58) Field of Search ............................... 714/739, 738; 395/497.01; 711/5; 307/269; 713/400; 371/22.3; 438/17; 326/16

(56) References Cited

U.S. PATENT DOCUMENTS

| | | | |
|---|---|---|---|
| 4,841,232 A | 6/1989 | Graham et al. ................ 324/73 |
| 4,870,346 A | 9/1989 | Mydilll et al. ................. 324/73 |
| 4,947,357 A | * 8/1990 | Stewart et al. ............. 371/22.3 |
| 5,042,034 A | 8/1991 | Correale, Jr. et al. ....... 371/22.3 |
| 5,091,908 A | 2/1992 | Zorian ........................ 371/21.5 |
| 5,115,435 A | * 5/1992 | Langford, II et al. ....... 371/22.3 |
| 5,336,939 A | * 8/1994 | Eitrheim et al. ............. 307/269 |
| 5,479,652 A | 12/1995 | Dreyer et al. .......... 395/183.06 |
| 5,528,602 A | 6/1996 | West et al. ................. 371/22.4 |
| 5,570,375 A | * 10/1996 | Tsai et al. ................... 371/22.3 |
| 5,574,733 A | 11/1996 | Kim .............................. 371/27 |
| 5,583,786 A | 12/1996 | Needham ..................... 364/488 |
| 5,638,382 A | 6/1997 | Krick et al. ................ 371/22.5 |
| 5,640,509 A | 6/1997 | Balmer et al. .......... 395/183.18 |
| 5,699,506 A | 12/1997 | Phillips et al. .......... 395/183.13 |
| 5,713,006 A | * 1/1998 | Shigeeda ................ 395/497.01 |
| 5,790,561 A | 8/1998 | Borden et al. ............. 371/22.1 |
| 5,804,561 A | 9/1998 | Hsia ........................... 324/158 |
| 5,925,144 A | 7/1999 | Sebaa .......................... 714/733 |
| 5,968,194 A | 10/1999 | Wu et al. .................... 714/726 |
| 5,978,946 A | 11/1999 | Needham ..................... 714/732 |
| 5,983,380 A | 11/1999 | Motika et al. .............. 714/733 |
| 6,023,778 A | 2/2000 | Li ............................... 714/726 |
| 6,081,904 A | * 6/2000 | Chencinski et al. ........ 713/400 |
| 6,173,356 B1 | * 1/2001 | Rao ............................... 711/5 |
| 6,357,027 B1 | * 3/2002 | Frankowsky ................ 714/738 |

* cited by examiner

*Primary Examiner*—Albert Decady
*Assistant Examiner*—Dipakkumar Gandhi
(74) *Attorney, Agent, or Firm*—Schwegman, Lundberg, Woessner & Kluth, P.A.

(57) ABSTRACT

A novel apparatus and methods provide the capability to structural test device input/output pins which are not connected to an external tester during the testing process. The method does not require a new Design For Test logic block, but rather, the method modifies existing registers on the chip to function as a (Pseudo Random Pattern Generator) PRPG and a MISR (Multiple Input Signature Register). The PRPG generates input patterns. The MISR generates an output signature. PRPG and MISR are both based on LFSR (Linear Feedback Shift Register). This allows running a random pattern generated by the PRPG, testing at-speed a path from the PRPG through the I/O logic circuitry interfacing to core logic, and storing a signature pattern in the MISR. The testing will take place at native speed of the device and no connection to the pins is required externally.

20 Claims, 2 Drawing Sheets

METHOD OF DETERMINING NON-ACCESSIBLE DEVICE I/O PIN SPEED USING ON CHIP LFSR AND MISR AS DATA SOURCE AND RESULTS ANALYZER RESPECTIVELY

FIELD OF THE INVENTION

The present invention relates generally to integrated circuit testing and more specifically to structural testing of integrated circuits.

BACKGROUND OF THE INVENTION

Integrated circuit test paradigms are defined by (a) the kind of test; (b) the kind of tester that stores and delivers the test; and (c) the test delivery mechanisms. The kind of test can be either structural or functional. Structural tests target manufacturing defects and attempt to ensure the manufacturing correctness of basic devices such as wires, transistors, etc. Functional tests, on the other hand, target device functionality and attempt to ensure that the device is functioning correctly. Functional tests are written primarily for architectural verification and silicon debug. Structural tests, on the other hand, are used primarily for manufacturing testing. Testers come in two varieties: functional and structural. Functional testers can drive a large number of input/output (I/O) pins at high data transfer rates with great timing accuracy. On the other hand, structural testers are limited in the number of I/O pins they can drive, as well as the speed and accuracy with which they can deliver data to the I/O pins. The cost of structural testers is considerably lower than the cost of functional testers. Tests can be delivered in one of two ways. The device's normal functional channels are used and the device runs at operating speed. Alternatively, special design-for-test (DFT) channels can be designed, and tests are applied through these channels at less than operational speed.

The test paradigm in use by many integrated circuit manufacturers today uses functional testers and functional tests. Unlike other test methods, functional testing does not require the behavior of the device under test (DUT) to be changed during the test mode. Thus, functional testing allows integrated circuit manufacturers to test a very large number of "actual functional paths" at speed using millions of vectors in a very short period of time, to thoroughly test all device I/Os with "tester-per-pin" ATE technology, and to test embedded caches in a proper functional mode. These tests are delivered using the functional channels and the functional tests are written manually. Such functional testing is facing serious challenges due to the rising cost of manual test generation and the increasing cost of high-speed testers. Using functional testers requires huge capital investment over short periods of time since they become obsolete very quickly. If current trends continue, the cost of testing a device could constitute a significant portion of the manufacturing cost. Thus, as the complexity of microprocessors increases, manual test writing for future microprocessors and other integrated circuits will become prohibitively expensive as well as time consuming.

As a result, the testing paradigm that is evolving among integrated circuit manufacturers is to use low-cost-low-pin-count structural testers and use automatic test pattern generation (ATPG) tools to generate the required tests. The tests being generated are structural tests. Structural testers have a small set of pins that operate at a lower frequency than the device and contact only a subset of its I/O pins. The device needs to be equipped with special DFT access ports to load and unload the vectors from the tester. The boundary scan test access port, scan input and output pins, and direct access test buses are typically used for this purpose.

Traditional I/O functional testing relies on the ability of the tester to control and observe the data, timing, and levels of each pin of the device under test connected to a tester channel. However, with the increasing use of structural testers, dedicated pin electronics are no longer available on the tester to make testing measurements on each I/O pin on the device.

Currently there is no method that allows structural testing of an I/O logic path at operating speed without being able to access device pins externally. What is needed is a method and apparatus to allow structural testing of the path between the core logic and the I/O logic to the pin level at speed when no external connection can be made to such device pins.

DESCRIPTION OF THE EMBODIMENTS

A novel method and apparatus for structural testing of integrated circuits is described. In the following detailed description of the embodiments, reference is made to the accompanying drawings which form a part hereof, and in which are shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present inventions. The following detailed description is, therefore, not to be taken in a limiting sense, and the scope of the present inventions is defined only by the appended claims.

Embodiments of the novel apparatus and methods described below provide a means to test device input/output pins of a device under test (DUT) which are not connected to a tester during the component manufacturing test operations. By modifying existing registers on the device under test, the device under test can be tested for at-speed operation without requiring access to all device pins externally.

Figure 1:
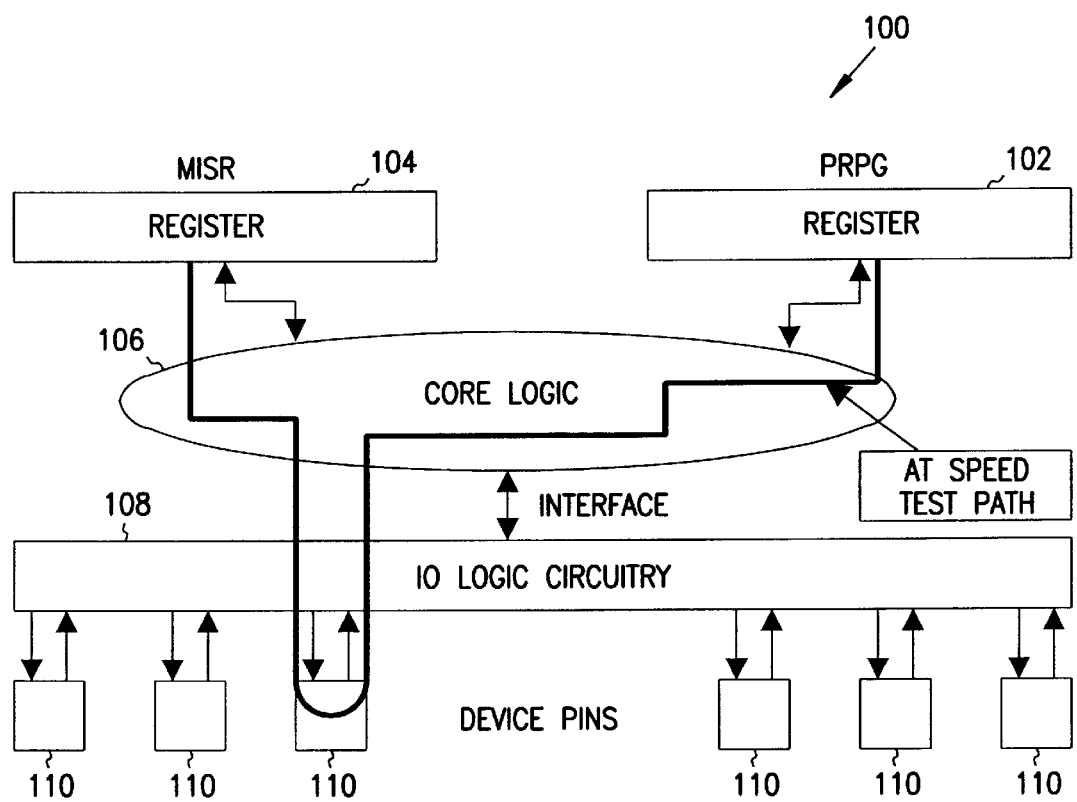
FIG. 1 is a block diagram of an example of a testing circuit according to one embodiment of the present invention.

FIG. 1 is a block diagram of an example of a testing circuit 100 according to one embodiment of the present invention. The testing circuit 100 comprises a Pseudo Random Pattern Generator (PRPG) 102, a Multiple Input Signature Register (MISR) 104, integrated circuit core logic 106, input/output (I/O) logic circuitry 108, and device pins 110.

The Pseudo Random Pattern Generator (PRPG) 102 generates pseudo random patterns (referred to herein as test patterns). In one embodiment, the PRPG is based on Linear Feedback Shift Register (LFSR). Because a PRPG repeats a set of patterns for a given initial state, it is not entirely random but rather pseudo-random. The feedback for a PRPG is usually chosen to be a maximal polynomial meaning that the feedback is implemented in such a way as to cause the PRPG register to cycle through all possible $2^N$ states except the all zero state (e.g., for a 3 bit register N=3 so 2.sup.N is 8-minus the zero state 000 is 7 different states). A PRPG does not have any external input, but starts from a fixed state (referred to as the seed) and continues through the sequence of all possible patterns. In one embodiment, a register on the integrated circuit to be tested is reconfigured to function as a PRPG 102.

The Multiple Input Signature Register (MISR) 104 generates an output signature. In one embodiment, the MISR is based on Linear Feedback Shift Register (LFSR). The MISR is a shift register in which the output from each bit stage (e.g., each flip-flop) of the register is exclusive ORed with an independent input to the register before being forwarded to the input of the succeeding flip-flop. Further, the output of particular ones of said bit stages are fedback to the first bit stage of the register through a series of cascaded feedback exclusive OR-gates. A given sequence of successive input signal conditions presented at the independent inputs of the MISR will result in a particular set of data (referred to herein as a signature pattern) existing in the MISR when the test sequence is completed. Thus, when a particular test pattern is applied at the circuit inputs, if the circuit has no faults which are tested by the test pattern, then the expected signature pattern will exist in the MISR at the end of the test.

The integrated circuit core logic 106 is the logic for performing the central functions of the integrated circuit. In one embodiment, the integrated circuit 100 is a processor and the core logic 106 performs the central functions of a processor.

The input/output (I/O) logic circuitry 108 includes circuitry for inputting and outputting data using the device pins 110. According to the example embodiment of the invention, at least some of the device pins 110 are nonaccessible by a structural testing device.

Figure 2:
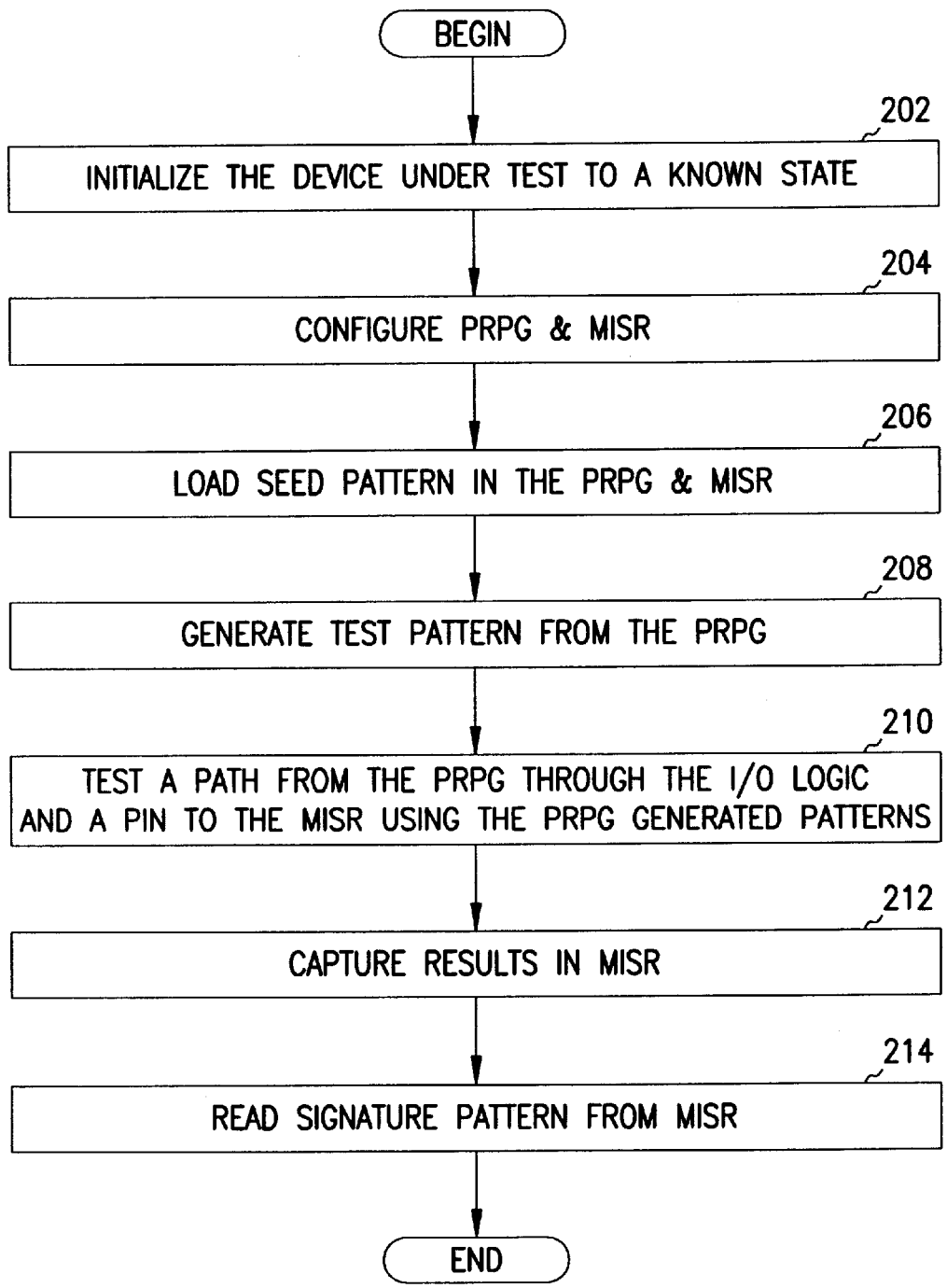
FIG. 2 is a flow chart of a method of structural testing an integrated circuit according to an example embodiment of the invention.

FIG. 2 is a flow chart of a method of structural testing an integrated circuit according to an example embodiment of the invention. The method comprises initializing the electronic device to a known state (block 202). In one embodiment, the initialization is controlled by an external testing device. The method includes configuring a first register on the integrated circuit to function as a pseudo random pattern generator (PRPG) and configuring a second register on the integrated circuit is configured to function as a multiple input signature register (MISR) (block 204). A seed pattern is loaded in the PRPG (block 206). The seed pattern may be any pattern having at least one nonzero bit. After the seed pattern is loaded, the PRPG generates a pseudo random pattern sequence of a desired length (block 208).

A structural test is performed on a path from the PRPG to the MISR using the test pattern (block 210). The path loops through an interface between the I/O logic and an I/O pin that is nonaccessible to an external tester (this path is shown in FIG. 1). In other words, the path tested begins in the core logic of the integrated circuit, then passes through an interface between the I/O logic of the integrated circuit and one of the I/O pins. Then the path loops back through the interface to the core logic. The structural test is executed at an operating speed of the integrated circuit components (including the core logic and the I/O logic) on the path. In one embodiment, the PRPG and the MISR are part of the integrated circuit core logic. The I/O logic operates at a speed which is substantially slower than the core logic. An advantage of the methods of the present invention is that the path transition from the speed of the core logic to the speed of the I/O logic can be tested without accessing the applicable I/O pin with an external tester. The structural test is repeated for a desired number of patterns.

The test results are captured in the MISR (block 212). Upon completion of the test, a signature pattern is read from the MISR (block 214). The signature pattern read from the MISR is compared with an expected signature pattern to determine if the electronic device is defective. For example, if no defects are detected by the structural test, the signature pattern and the expected signature pattern will match. On the other hand, if the signature pattern and the expected signature pattern do not match, a defect is present in the integrated circuit.

The method shown in FIG. 2 is performed on, but is not limited to, wafers, integrated circuit packages, integrated circuits mounted on a board, and integrated circuit mounted on a board in a multiple board computer system. In one embodiment, the integrated circuit is a processor.

It is to be understood that the above description is intended to be illustrative, and not restrictive. Many other embodiments will be apparent to those of skill in the art upon reviewing the above description. For example, the I/O interface that the test path loops through may be an interface between two different chips that operate at different frequencies. In another example, boundary scan registers may be configured to function as the PRPG and/or the MISR. The scope of the invention should, therefore, be determined with reference to the appended claims, along with the full scope of equivalents to which such claims are entitled.

What is claimed is:

1. A method of structural testing an integrated circuit, the method comprising:

configuring a first core logic register of the integrated circuit to function as a pseudo random pattern generator (PRPG);

configuring a second core logic register of the integrated circuit to function as a multiple input signature register (MISR);

generating a test pattern by the PRPG; and using the test pattern to perform a structural test on a path from the PRPG to the MISR wherein the path loops through an interface between input/output (I/O) logic of the integrated circuit and an I/O pin that is nonaccessible to an external tester.

2. The method of claim 1 wherein the structural test is executed at an operating speed of the core logic and an operating speed of the I/O logic.

3. The method of claim 2 wherein the method is performed on an integrated circuit wafer.

4. The method of claim 2 wherein the method is performed on an integrated circuit package.

5. The method of claim 2 wherein the method is performed on an integrated circuit mounted on a board.

6. The method of claim 2 wherein the method is performed on an integrated circuit mounted on a board in a multiple board computer system.

7. The method of claim 2 wherein the integrated circuit is a processor.

8. A method of structural testing an electronic device having at least one I/O pin that is nonaccessible to an external tester, the method comprising:

initializing the electronic device to a known state;

modifying a first register on the integrated circuit to function as a pseudo random pattern generator (PRPG);

modifying a second register on the integrated circuit to function as a multiple input signature register (MISR);

loading a seed pattern in the PRPG;

generating a pseudo random pattern using the PRPG;

testing a path from the PRPG through an interface between the core logic and the electronic device's I/O logic to an I/O pin and returning through the I/O logic and the core logic to the MISR;

storing a signature pattern in the MISR; and reading a signature pattern from the MISR upon completion of the test.

9. The method of claim 8 wherein the first register and the second register are in the electronic device's core logic.

10. The method of claim 9 wherein testing the path is performed at the operating speed of the components on the path.

11. The method of claim 10 wherein the operating speed of the I/O logic is slower than the operating speed of the electronic device's core logic.

12. The method of claim 8 further comprising comparing the signature pattern with an expected pattern to determine if the electronic device is defective.

13. The method of claim 12, wherein the initializing and the comparing is performed by a low-pin count tester.

14. The method of claim 8 wherein the electronic device is a processor.

15. A method of performing a structural test on an I/O logic circuitry interfacing to core logic and to a pin that is nonaccessible by external test equipment, the method comprising:

generating a pseudo random pattern;

testing a path from a pseudo random pattern generator (PRPG) through the I/O logic circuitry interfacing to core logic; and storing a signature pattern in a multiple input signature register (MISR).

16. The method of claim 15 wherein testing a path includes testing a path through an I/O logic circuitry interface is on a different chip.

17. The method of claim 15 wherein the two chips operate at a different frequency.

18. A method for testing an I/O pin of an integrated circuit, the method comprising:

generating, by a pseudo random pattern generator (PRPG) in the integrated circuit, a test pattern for testing an I/O pin, the test pattern having a plurality of bits;

transmitting the plurality of bits of the test pattern at operating speed along a loop path from the PRPG through an I/O pin to a multiple input signature register (MISR) on the integrated circuit, the I/O pin having no direct connection to a tester external to the integrated circuit;

storing the plurality of bits within the MISR;

reading, by an external tester, the plurality of bits from the MISR;

verifying, by the external tester, that the I/O pin is functioning properly.

19. The method of claim 18 wherein the PRPG is a boundary scan register.

20. The method of claim 18 wherein the MISR is a boundary scan register.

* * * * *